(12) United States Patent
Bowles et al.

(10) Patent No.: US 8,884,413 B2
(45) Date of Patent: Nov. 11, 2014

(54) LEADFRAMES, AIR-CAVITY PACKAGES, AND ELECTRONIC DEVICES WITH OFFSET VENT HOLES, AND METHODS OF THEIR MANUFACTURE

(75) Inventors: Philip H. Bowles, Fountain Hills, AZ (US); Stephen R. Hooper, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 56 days.

(21) Appl. No.: 13/600,648

(22) Filed: Aug. 31, 2012

(65) Prior Publication Data

US 2014/0061883 A1    Mar. 6, 2014

(51) Int. Cl.
*H01L 23/495*    (2006.01)
*H01L 21/56*    (2006.01)

(52) U.S. Cl.
USPC .... 257/676; 257/666; 257/667; 257/E23.031; 257/E23.046; 438/111; 438/123; 174/536

(58) Field of Classification Search
USPC .......... 257/666, 667, E23.031, E23.046, 676; 438/111, 123; 174/536
See application file for complete search history.

(56) References Cited

U.S. PATENT DOCUMENTS

| | | | |
|---|---|---|---|
| 6,483,178 B1 * | 11/2002 | Chuang | 257/672 |
| 7,550,828 B2 | 6/2009 | Ramakrishna et al. | |
| 2004/0175864 A1 * | 9/2004 | Mahle | 438/107 |
| 2008/0157301 A1 | 7/2008 | Ramakrishna et al. | |
| 2009/0212404 A1 * | 8/2009 | Sim et al. | 257/667 |
| 2009/0263937 A1 | 10/2009 | Ramakrishna et al. | |

OTHER PUBLICATIONS

U.S. Appl. No. 13/478,557, Hooper, et al., "Cavity-Type Semiconductor Package and Method of Packaging Same", filed May 23, 2012.

\* cited by examiner

*Primary Examiner* — Peniel M Gumedzoe
(74) *Attorney, Agent, or Firm* — Sherry W. Schumm

(57) ABSTRACT

A leadframe (e.g., incorporated in a device package) includes a feature (e.g., a die pad or lead) with a vent hole formed between first and second opposed surfaces. The cross-sectional area of the vent hole varies substantially between the surfaces (e.g., the vent hole has a constricted portion). The vent hole may be formed from a first opening extending from the first surface toward the second surface to a first depth that is less than a thickness of the leadframe feature, and a second opening extending from the second surface toward the first surface to a second depth that is less than the thickness of the leadframe feature, but that is large enough for the second opening to intersect the first opening. Vertical central axes of the openings are horizontally offset from each other, and the constricted portion of the vent hole corresponds to the intersection of the openings.

17 Claims, 8 Drawing Sheets

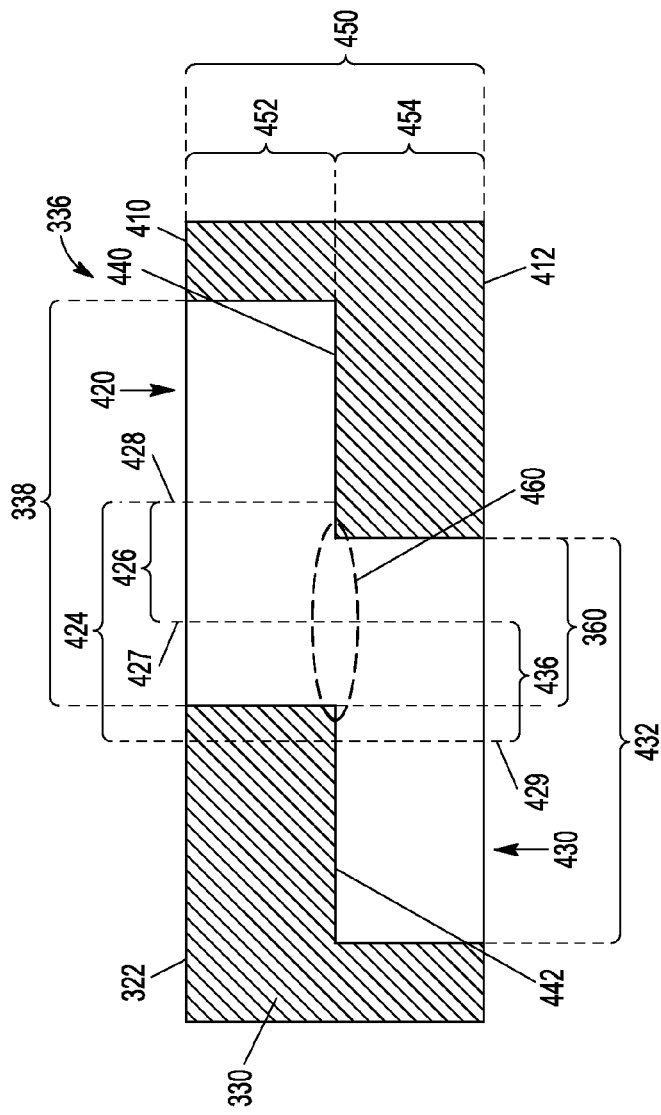
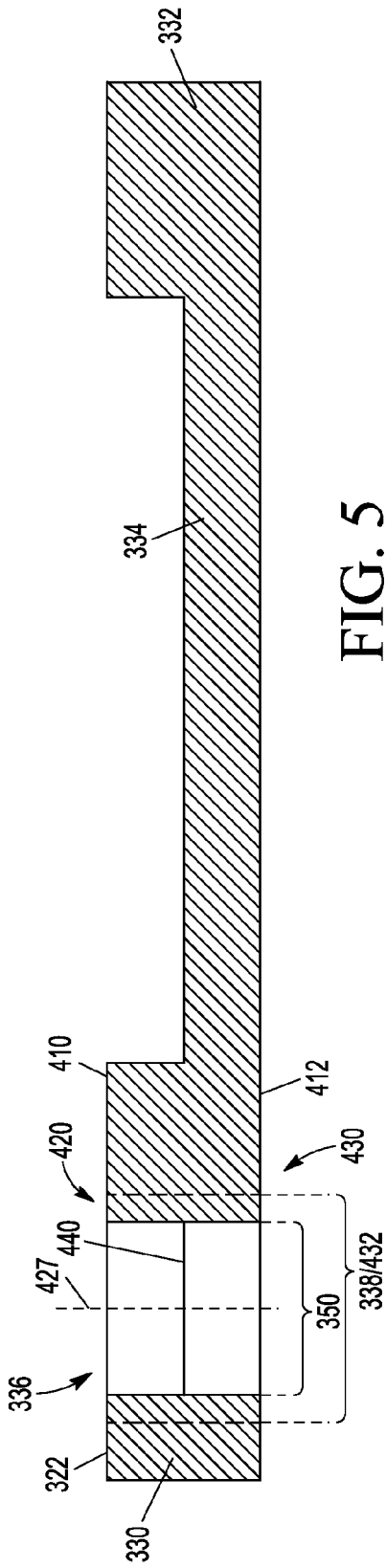
FIG. 4
FIG. 5

LEADFRAMES, AIR-CAVITY PACKAGES, AND ELECTRONIC DEVICES WITH OFFSET VENT HOLES, AND METHODS OF THEIR MANUFACTURE

TECHNICAL FIELD

Embodiments of the subject matter described herein relate generally to electronic devices with air-cavity packages, leadframes for such devices, and methods of their manufacture.

BACKGROUND

Electronic device air-cavity packages include a base and a lid, which together define an enclosed interior cavity within which various types of electronic die may be attached. In some types of packages, the base comprises a die pad (or "flag") surrounded by a plurality of leads, where the combination is structurally supported by molding compound. Typically, manufacturing the base involves providing a leadframe (i.e., a conductive structure that includes one or more instances of the die pad/lead combination, held in spatial orientation by sacrificial features), placing the leadframe in a mold, and surrounding side surfaces of the die pad and leads with the molding compound so that top and bottom surfaces of the die pad and leads are exposed.

During the device assembly process, one or more dies are attached to the die pad, electrical connections are established between the die and the leads (e.g., using wirebonds and/or other conductive features), and the lid is attached to the base. When a lid is to be permanently attached to the base, a heat-curably epoxy is typically applied to the mating surface of the lid and/or base, and the assembly is cured at an elevated temperature (e.g., between about 150° C. to 175° C.) for a cure period (e.g., about an hour). To allow for pressure normalization between the air cavity and the external environment during the lid cure process, one or more vent holes are typically provided in the assembly prior to the process. The holes may be later sealed to hermetically or semi-hermetically seal the air cavity, although the holes may be left open, in some packages.

Although provision of vent holes reduces the likelihood that the seal between the base and the lid may rupture during the lid attach process (e.g., due to differential pressures between the air cavity and outside environment), the use of such holes is not without its issues. For example, debris from the outside environment may enter the air cavity through the vent holes when they are unsealed, and this debris could short exposed wirebonds or other conductive features within the air cavity. Accordingly, although the use of vent holes alleviates some manufacturing issues, the vent holes cause other issues.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 4 is a cross-sectional view of a lead of the leadframe of FIG. 3 along line 4-4;

FIG. 5 is a cross-sectional view of a lead of the leadframe of FIG. 3 along line 5-5;

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

For the purpose of indicating the relative orientation of various surfaces, axes, and other features or dimensions with respect to each other, the terms "vertical" and "horizontal" may be used herein. More specifically, a "vertical" surface, axis, feature or dimension may be interpreted as a surface, axis, feature or dimension that is approximately perpendicular (e.g., +/−10 degrees) to a "horizontal" surface, axis, feature or dimension, and vice versa. It is to be understood that the use of the terms is not meant to imply a relative orientation with respect to a fixed coordinate system (e.g., an Earth-based coordinate system).

Embodiments include leadframes and devices with vent holes through one or more leadframe features (e.g., leads and/or the die pad). As will be explained in more detail below, the vent holes are configured in a manner that reduces the likelihood that debris of sufficient size to short internal conductive structures may enter the air cavity during the lid attach process. For example, each vent hole may be constructed so that the minimum cross-sectional area of a vent hole (i.e., a portion of the vent hole between the top and bottom surfaces of the leadframe feature that has the smallest opening area) is significantly narrower than the cross-sectional area of the vent hole at the top or bottom surfaces of the leadframe feature. In other words, according to various embodiments, each vent hole includes a constriction (or constricted portion) in the vent hole between the top and bottom surfaces of the leadframe feature.

Figure 1:
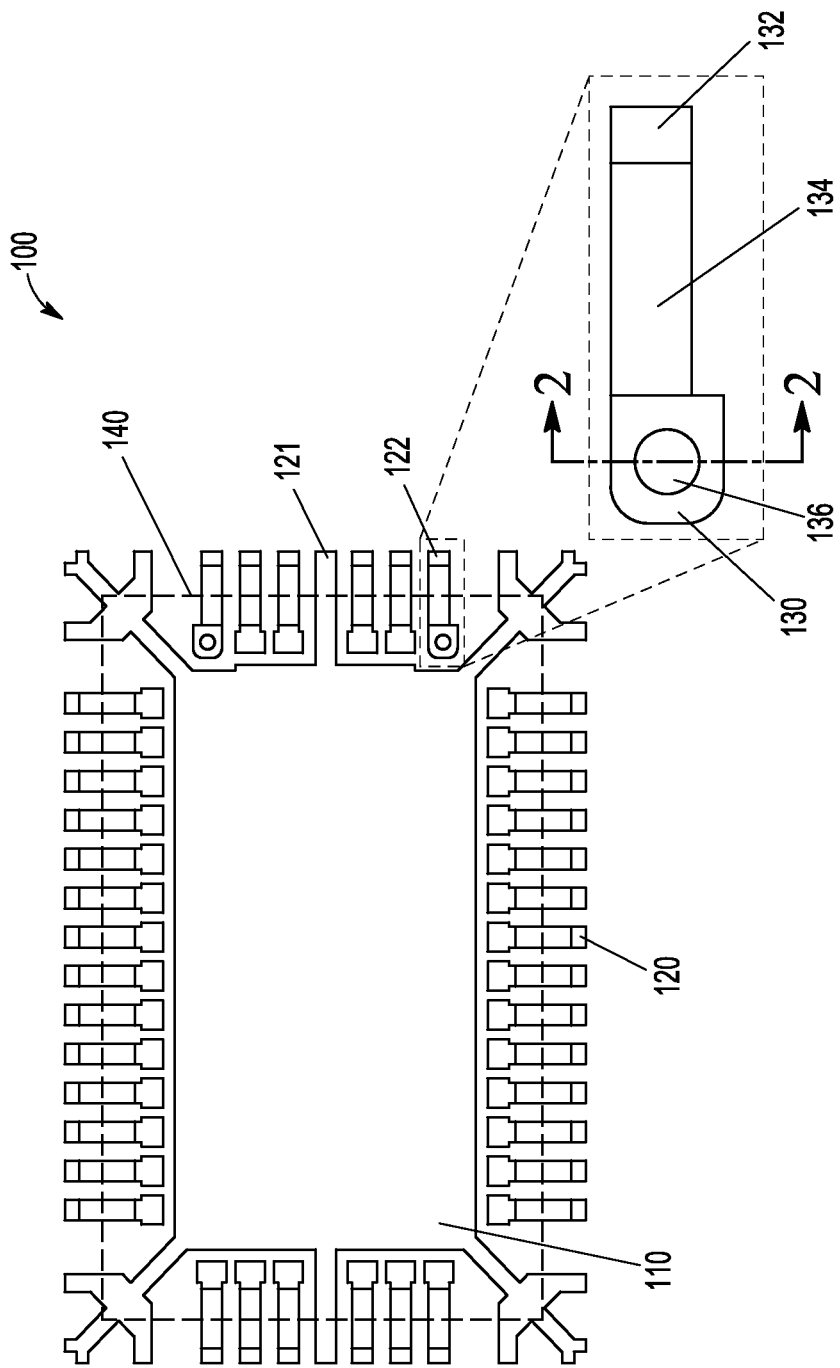
FIG. 1 is a top view of a leadframe with a vent hole formed through a lead.

For purposes of comparison, FIG. 1 is a top view of a leadframe 100 with a vent hole 136 formed through a lead 122, where the vent hole 136 has a substantially constant, cross-sectional opening area. FIG. 1 also depicts an enlarged view of a particular lead 122 of leadframe 100, so that certain features of the lead 122 are more easily visible. Although FIG. 1 illustrates only a single "cell" of a leadframe, it is to be understood that a leadframe may include multiple cells (i.e., multiple iterations of leadframe 100), which are connected together with sacrificial features. Such a configuration facilitates parallel manufacturing of multiple electronic devices (e.g., one electronic device for each leadframe cell). After performing some or all processes associated with manufacturing electronic devices using the leadframe cells, the devices may be separated from each other by removing the sacrificial features connecting the leadframe cells (i.e., the devices are singulated). For purposes of simplicity, FIG. 1 illustrates only one cell of a leadframe without any sacrificial features, and the single cell is referred to as leadframe 100.

Leadframe 100 includes a substantially planar, conductive die pad 110 and a plurality of conductive leads 120, 121, 122 located around a perimeter of the die pad 110. Leads 120-122 may be substantially co-planar with the die pad, although some or all of the leads 120-122 may not be co-planar and/or may be bent, as well. Leads 120, 122 are spatially separated from die pad 110, so that the leads 120, 122 may be electrically isolated from the die pad 110 during later manufacturing steps, if desired. In contrast, lead 121 is integrally formed with die pad 110. Accordingly, when it is desired to use die pad 110 as a ground plane for a subsequently manufactured device, lead 121 may be used to electrically connect with the ground plane.

Leads 120-122 may have an elongated shape, as shown in FIG. 1, where an inner end of each lead 120-122 is oriented toward die pad 110, and an outer end of each lead 120-122 is oriented away from die pad 110. For example, lead 122 includes an inner portion 130 at the inner end, an outer portion 132 at the outer end, and an intermediate portion 134 extending between them. The thickness of the intermediate portion 134 may be less than the thickness of the inner and outer portions 130, 132 to accommodate molding compound above the intermediate portion 134. The recession defined by intermediate portion 134 may provide a mold lock feature and space for electrical insulation between the intermediate portion 134 of the lead 122 and a lid (perimeter indicated by dashed line 140), once the lid is attached. Alternatively, the intermediate portion 134 may not be thinner than the inner and/or outer portions 130, 132. After providing molding compound (not illustrated) to fix the relative orientation of the die pad 110 and leads, the lid may be attached above the intermediate portion 134. After lid attach, the top surface of the inner portion 130 may be exposed within the air cavity defined by the die pad, molding compound, and lid. The bottom surfaces of inner, intermediate, and outer portions 130, 132, 134 may be exposed to the exterior environment.

Figure 2:
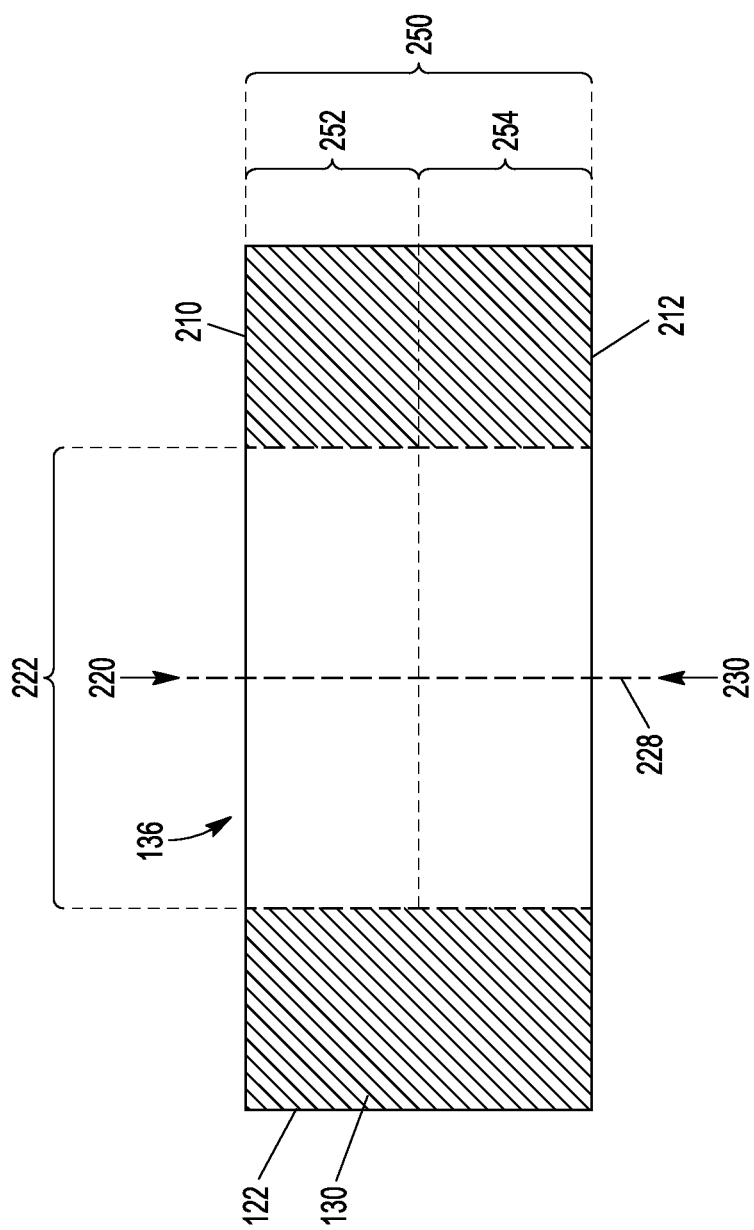
FIG. 2 is a cross-sectional view of a lead of the leadframe of FIG. 1 along line 2-2.

Referring also to FIG. 2, which is a cross-sectional view of a lead 122 of the leadframe 100 of FIG. 1 along line 2-2, a vent hole 136 extends through the inner portion 130 of lead 122. The location of the vent hole 136 is within the perimeter of the lid (indicated by dashed box 140), so that the vent hole 136 may allow for pressure regulation (e.g., airflow) between the air cavity and the exterior environment during the lid attach and subsequent cure process.

Vent hole 136 extends between the top and bottom surfaces 210, 212 of lead 122. Vent hole 136 may be formed, for example, using a stamping, drilling, or etching process (e.g., an isotropic etching process). When an isotropic etching process is used to form vent hole 136, the diameter 222 of the vent hole 136 may be related to the thickness 250 of the lead 122 and the method of performing the etch. More particularly, an isotropic etching process typically removes material at approximately a same rate in all directions. Accordingly, the diameter of an opening formed using an isotropic etch may approximately equal twice the depth of the etch (assuming the opening is not etched all the way through the material). It is desirable to maximize the depth to diameter ratio of vent hole 136, so that relatively large debris cannot enter the air cavity during lid attach and subsequent processes (i.e., debris having dimensions larger than the diameter 222 of the vent hole 136). To maximize the depth to diameter ratio, vent hole 136 may be formed by isotropically etching lead 122 from both the top and bottom surfaces 210, 212. For example, to form vent hole 136, a first opening 220 may be etched extending from the top surface 210 toward the bottom surface 212 to a first depth 252 that is less than the thickness 250 of the lead 122, and a second opening 230 may be etched extending from the bottom surface 212 toward the top surface 210 to a second depth 254 that is less than the thickness 250 of the lead 122, but that is large enough for the second opening 230 to intersect the first opening 220. The vertical central axes 228 (i.e., axes that are approximately perpendicular to the top and bottom surfaces 210, 212) of the openings 220, 230 are substantially aligned and co-linear, so that the cross-sectional area of vent hole 136 is substantially constant between the top and bottom surfaces 210, 212. In some cases, a relatively narrow, radial lip may extend into the vent hole 136 at the intersection of the first and second openings 220, 230, but such a feature is not considered to result in a substantially different, cross-sectional area within the vent hole 136.

As used herein, the vertical central axes (e.g., axes 228) of two openings may be considered to be "aligned" when the axes are separated by a horizontal distance between 0% and 10% of the diameter of the openings. Alternatively, the vertical central axes (e.g., axes 228) of two openings may be considered to be "aligned" when the axes are separated by a horizontal distance between 0% and 25% of the diameter of the openings. For example, a horizontal offset between the vertical central axes of up to 10% or up to 25% of the diameter of the openings may occur due to unintentional registration inaccuracies. As used herein, the cross-sectional area of a vent hole (e.g., vent hole 136) may be considered to be "substantially constant" if no two cross-sectional areas along the length of the vent hole differ by more than 10%. Alternatively, the cross-sectional area of a vent hole (e.g., vent hole 136) may be considered to be "substantially constant" if no two cross-sectional areas along the length of the vent hole differ by more than 25%. As used herein, a "minimum cross-sectional area" refers to the smallest cross-sectional area along the length of a vent hole.

As indicated previously, debris may enter an air cavity through vent hole 136 during and after the lid attach process. The size of the debris that may enter the air cavity through the vent hole 136 is limited by the minimum cross-sectional area along the length of the vent hole 136. Accordingly, if vent hole 136 has a relatively large, cross-sectional area, relatively large debris may enter the air cavity through vent hole 136. Conversely, if vent hole 136 has a relatively small cross-sectional area, only smaller debris may enter the air cavity through vent hole 136. In various embodiments, a leadframe includes an "offset vent hole," which includes a constriction in the vent hole between the top and bottom surfaces of a leadframe feature, where the constriction defines the minimum cross-sectional area of the offset vent hole. The minimum cross-sectional area of the offset vent hole is significantly smaller than the minimum cross-sectional area of a vent hole (e.g., vent hole 136) formed using intersecting openings with aligned, vertical central axes.

Figure 3:
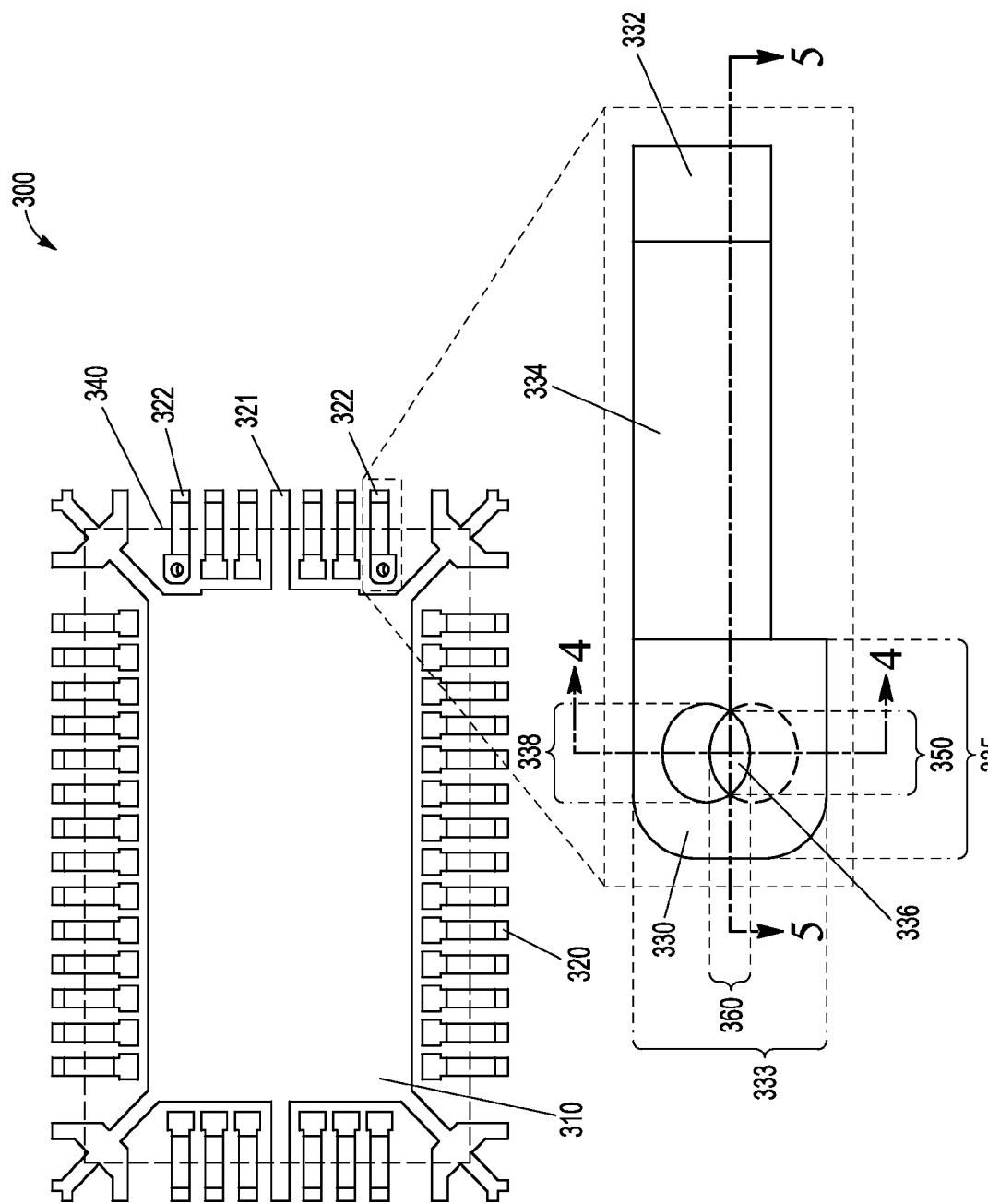
FIG. 3 a top view of a leadframe with an offset vent hole formed through a lead, in accordance with an example embodiment.

For example, FIG. 3 is a top view of a leadframe 300 with an offset vent hole 336 formed through a lead 322, in accordance with an example embodiment. For enhanced understanding, FIG. 3 should be viewed in conjunction with FIGS. 4 and 5, where FIG. 4 is a cross-sectional view of a lead of the leadframe of FIG. 3 along line 4-4, and FIG. 5 is a cross-sectional view of a lead of the leadframe of FIG. 3 along line 5-5. FIG. 3 also depicts an enlarged view of a particular lead 322 of leadframe 300, so that certain features of the lead 322 are more easily visible. As with FIG. 1, although FIG. 3 illustrates only a single "cell" of a leadframe, it is to be understood that a leadframe may include multiple cells (i.e., multiple iterations of leadframe 300), which are connected together with sacrificial features that may be subsequently removed during the process of singulating leadframe cells, packages, or devices.

As will be discussed in detail below, the offset vent hole 336 of leadframe 300 differs from the vent hole 136 (FIG. 1) of leadframe 100 in that offset vent hole 336 does not have a substantially constant cross-sectional area along the length of offset vent hole 336. Instead, according to an embodiment, offset vent hole 336 includes a constriction (e.g., constricted portion 460) between the top and bottom surfaces 410, 412 of the lead 322. According to an embodiment, the vertical central axes 429, 429 of opposed openings 420, 430 (FIG. 4) used to form offset vent hole 336 are intentionally offset and mis-aligned in order to reduce the cross-sectional area of offset vent hole 336 at the constricted portion 460, where the minimum cross-sectional area of the offset vent hole 336 occurs. Accordingly, offset vent hole 336 does not have a substantially constant cross-sectional area along the length of offset vent hole 336.

Similar to the leadframe 100 of FIG. 1, leadframe 300 includes a substantially planar, conductive die pad 310 and a plurality of conductive leads 320, 321, 322 located around a perimeter of the die pad 310. Leads 320-322 may be substantially co-planar with the die pad, although some or all of the leads 320-322 may not be co-planar and/or may be bent, as well. Leads 320, 322 are spatially separated from die pad 310, so that the leads 320, 322 may be electrically isolated from the die pad 310 during later manufacturing steps, if desired. In contrast, lead 321 is integrally formed with die pad 310. Accordingly, when it is desired to use die pad 310 as a ground plane for a subsequently manufactured device, lead 321 may be used to electrically connect with the ground plane. According to an embodiment, die pad 310 and leads 320-322 have thicknesses (i.e., the dimension between the top and bottom surfaces) in a range of about 100 micrometers (μm) to about 300 μm (e.g., about 200 μm), although die pad 310 and/or leads 320-322 may be thicker or thinner, as well.

Leads 320-322 may have an elongated shape, in an embodiment, where an inner end of each lead 320-322 is oriented toward die pad 310, and an outer end of each lead 320-322 is oriented away from die pad 310. For example, lead 322 includes an inner portion 330 at the inner end, an outer portion 332 at the outer end, and an intermediate portion 334 extending between them. According to an embodiment, the inner portion 330 of lead 322 has a width 333 in a range of about 200 μm to about 400 μm (e.g., about 300 μm), and has a length 335 in a range of about 200 μm to about 400 μm (e.g., about 300 μm), although the width 333 and/or length 335 may be larger or smaller, as well. The thickness of the intermediate portion 334 may be less than the thickness of the inner and outer portions 330, 332 to accommodate molding compound above the intermediate portion 334. The recession defined by intermediate portion 334 may provide a mold lock feature and space for electrical insulation between the intermediate portion 334 of the lead 322 and a lid (perimeter indicated by dashed line 340), once the lid is attached. Alternatively, the intermediate portion 334 may not be thinner than the inner and/or outer portions 330, 332. After providing molding compound (not illustrated) to fix the relative orientation of the die pad 310 and leads 320-322, the lid may be attached above the intermediate portion 334. After lid attach, the top surface of the inner portion 330 may be exposed within the air cavity defined by the die pad 310, molding compound, and lid. The bottom surfaces of inner, intermediate, and outer portions 330, 332, 334 may be exposed to the exterior environment. In other embodiments, the shape(s) of leads 320-322 may be different from that illustrated and described above.

An offset vent hole 336 is formed in the inner portion 330 of one or more leads 322 or other leadframe features (e.g., die pad 310), in an embodiment. Although offset vent holes 336 are shown in two leads 322 in FIG. 3, it is to be understood that offset vent holes 336 may be formed in more than two leads 320-322 and/or in as few as a single lead 322. In still other alternate embodiments, an offset vent hole also or alternatively may be formed in die pad 310. Accordingly, the description herein may refer to formation of a vent hole in a "leadframe feature" (i.e., a conductive feature of a leadframe, including a die pad or a lead). Either way, each offset vent hole 336 is located within the perimeter of the lid (indicated by dashed box 340), so that each offset vent hole 336 is positioned to allow for pressure regulation (e.g., airflow) between the air cavity and the exterior environment during the lid attach process.

In the embodiment illustrated in FIGS. 3-5, offset vent hole 336 extends between the top and bottom surfaces 410, 412 of lead 322. Offset vent hole 336 may be formed, for example, using a drilling or etching process (e.g., an isotropic etching process). According to an embodiment in which offset vent hole 336 is formed using an isotropic etching process, the depth to diameter ratio of offset vent hole 336 is maximized by etching lead 322 from both the top and bottom surfaces 410, 412. For example, to form offset vent hole 336, a first opening 420 may be etched extending from the top surface 410 toward the bottom surface 412 to a first depth 452 that is less than the thickness 450 of the lead 322, and a second opening 430 may be etched extending from the bottom surface 412 toward the top surface 410 to a second depth 454 that is less than the thickness 450 of the lead 322, but that is large enough for the second opening 430 to intersect the first opening 420. According to an embodiment, the first and second depths 452, 454 are approximately equal (e.g., approximately 50% of the thickness 450 of the lead 322), although they may be unequal, as well. In addition, according to an embodiment, the cross-sectional areas 338, 432 of openings 420, 430 are approximately equal at surfaces 410, 412, respectively. In other embodiments, the cross-sectional areas 338, 432 at surfaces 410, 412 may not be equal.

In contrast with the openings 220, 230 formed to produce vent hole 136 (FIGS. 1, 2), the vertical central axes 428, 429 of the openings 420, 430 formed to produce offset vent hole 336 are intentionally horizontally offset or mis-aligned (i.e., intentionally mis-registered so that they are not aligned or co-linear), so that the cross-sectional area of offset vent hole 336 varies substantially between the top and bottom surfaces 410, 412. In other words, a substantial offset between the vertical central axes 428, 429 results in a constricted portion 460 of offset vent hole 336 at the intersection of the first and second openings 420, 430.

The vertical central axis 427 of offset vent hole 336 may be considered to be halfway between the vertical central axes 428, 429 of first and second openings 420, 430. Accordingly, each of the vertical central axes 428, 429 of first and second openings 420 are offset from the vertical central axis 427 of offset vent hole 336 by substantially equal offset distances 426, 436, respectively. In an embodiment, the vertical central axes 428, 429 are offset from each other by a horizontal offset distance 424 in a range between about 10% and about 90% of the diameter 338, 432 of the openings at a top or bottom surfaces 410, 412 of the lead 322 (or the diameter of the smaller opening, if they are not equal in diameter). Alternatively, the vertical central axes 428, 429 are offset from each other by a horizontal offset distance 424 in a range between about 25% and about 75% of the diameter 338, 432 of the openings at a top or bottom surfaces 410, 412 of the lead 322

(or the diameter of the smaller opening, if they are not equal in diameter). Alternatively, the vertical central axes 428, 429 are offset from each other by a horizontal offset distance 424 in a range between about 50% and about 90% of the diameter 338, 432 of the openings at a top or bottom surfaces 410, 412 of the lead 322 (or the diameter of the smaller opening, if they are not equal in diameter).

Due to the offset between the vertical central axes 428, 429 of the first and second openings 420, 430, the cross-sectional area of offset vent hole 336 varies substantially along its length. For example, for the substantially cylindrical openings 420, 430, the cross-sectional area of offset vent hole 336 at either surface 410, 412 is a function of the diameters 338, 432 of the openings 420, 430 at the surfaces 410, 412. Conversely, the cross sectional area of the offset vent hole 336 at the constricted portion 460 is a function of the degree that openings 420, 430 intersect at the constricted portion 460. Referring to FIG. 3, the "eye-shaped" cross-sectional area at the constricted portion 460 is a function of the major and minor dimensions 350, 360 of the opening at the constricted portion 460. For example, if the openings each had a 200 μm diameter and zero offset between their vertical axes (e.g., openings 120, 130, FIGS. 1, 2), the major and minor dimensions of the cross sectional area would be 200 μm along the entire length of the vent hole. However, as the offset between the first and second openings 420, 430 increases, both the major and minor dimensions 350, 360 at the constricted portion 460 decrease. For example, given openings 420, 430 with a 200 μm diameter and a 50 μm offset between vertical central axes 428, 429 (e.g., an offset of 25% of the diameter of the openings 420, 430), the major dimension 350 would reduce to about 193.6 μm, and the minor dimension 360 would reduce to about 150 μm. As another example, given openings 420, 430 with a 200 μm diameter and a 150 μm offset between vertical central axes 428, 429 (e.g., an offset of 75% of the diameter of the openings 420, 430), the major dimension 350 would reduce to about 132.3 μm, and the minor dimension 360 would reduce to about 50 μm.

As used herein, the cross-sectional area of a vent hole (e.g., offset vent hole 336) may be considered to "vary substantially" (i.e., not to be "substantially constant") if any two cross-sectional areas along the vertical length of the vent hole differ by more than 10% (e.g., differ by about 10% to about 90%). Alternatively, the cross-sectional area of a vent hole (e.g., offset vent hole 336) may be considered to "vary substantially" if any two cross-sectional areas along the vertical length of the vent hole differ by more than 25% (e.g., differ by about 25% to about 90%). Alternatively, the cross-sectional area of a vent hole (e.g., offset vent hole 336) may be considered to "vary substantially" if any two cross-sectional areas along the vertical length of the vent hole differ by more than 50% (e.g., differ by about 50% to about 90%). Alternatively, the cross-sectional area of a vent hole (e.g., offset vent hole 336) may be considered to "vary substantially" if any two cross-sectional areas along the vertical length of the vent hole differ by more than 75% (e.g., differ by about 75% to about 90%).

Because the vertical central axes 428, 429 of the openings 420, 430 are offset, and the openings 420, 430 do not extend through an entire thickness 450 of the lead 322, each of the openings 420, 430 are partially defined by bottom surfaces 440, 442 (e.g., shelves within the interior of the offset vent hole 336. In addition, the implementation of offset vertical central axes 428, 429 results in the constricted portion 460 of offset vent hole 336. As used herein, a vent hole is considered to include a "constriction" or "constricted portion" (e.g., constricted portion 460) when the vent hole includes a portion at which the maximum and minimum cross-sectional areas of the vent hole differ by more than 10% (e.g., differ by about 10% to about 90%), where the "constriction" or "constricted portion" occurs at the location along the vent hole with the minimum cross-sectional area. Alternatively, a vent hole is considered to include a "constriction" or "constricted portion" (e.g., constricted portion 460) when the vent hole includes a portion at which the maximum and minimum cross-sectional areas of the vent hole differ by more than 25% (e.g., differ by about 25% to about 90%). Alternatively, a vent hole is considered to include a "constriction" or "constricted portion" (e.g., constricted portion 460) when the vent hole includes a portion at which the maximum and minimum cross-sectional areas of the vent hole differ by more than 50% (e.g., differ by about 50% to about 90%). Alternatively, a vent hole is considered to include a "constriction" or "constricted portion" (e.g., constricted portion 460) when the vent hole includes a portion at which the maximum and minimum cross-sectional areas of the vent hole differ by more than 75% (e.g., differ by about 75% to about 90%).

As the Figures and the above description indicate, offsetting the vertical central axes 428, 429 of openings 420, 430 allows an offset vent hole 336 to be formed, which has a minimum cross-sectional area that is significantly less than the cross-sectional area of a vent hole formed from aligned openings (e.g., vent hole 136), given same diameter openings. Accordingly, implementation of the various embodiments may restrict relatively large debris from entering an air cavity during a lid attach process, where such debris may enter an air cavity when aligned openings are implemented. Accordingly, implementation of the various embodiments may result in a substantial benefit in terms of manufacturing yield and device reliability.

Figure 6:
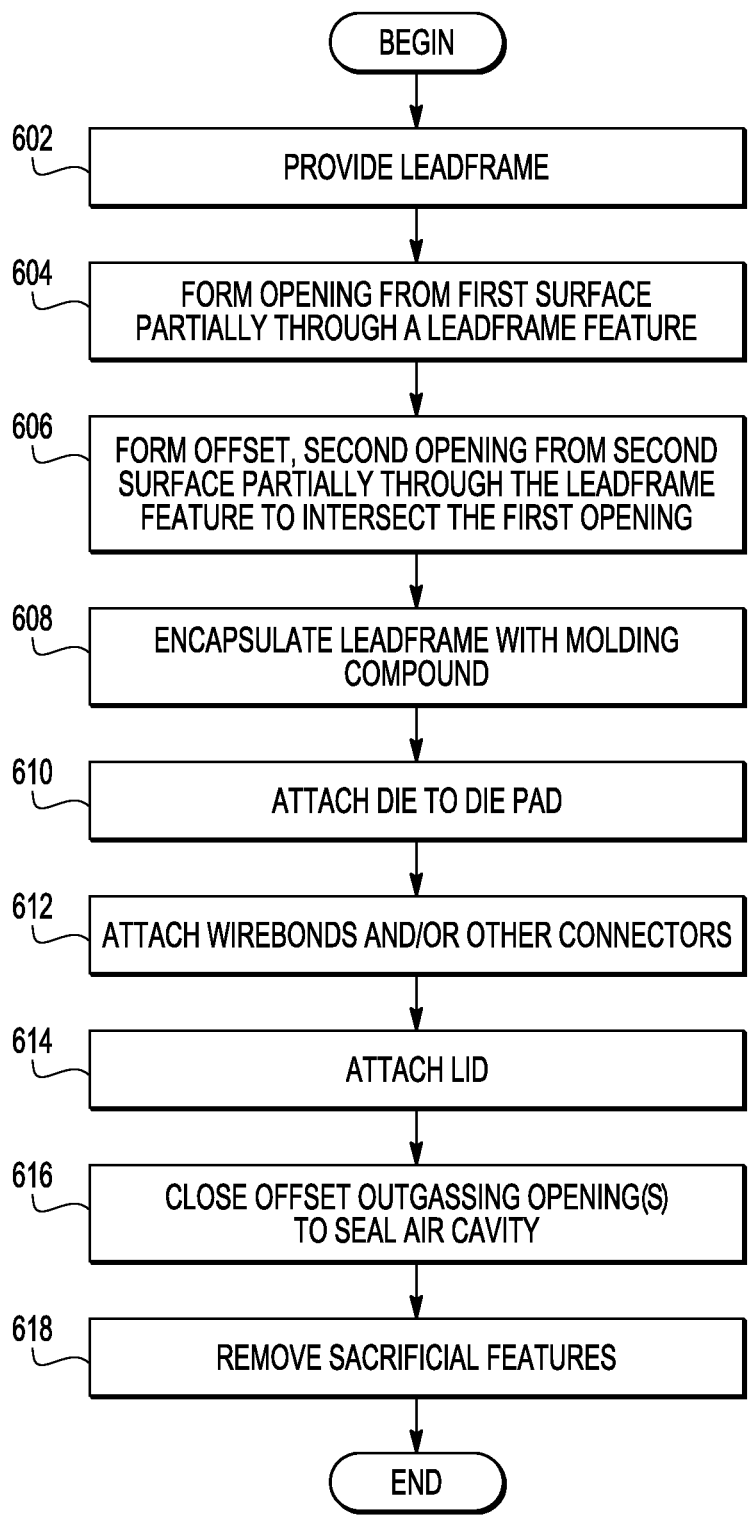
FIG. 6 illustrates a flowchart of a method of manufacturing a leadframe and an air-cavity package for an electronic device, in accordance with various embodiments.
Figure 8:
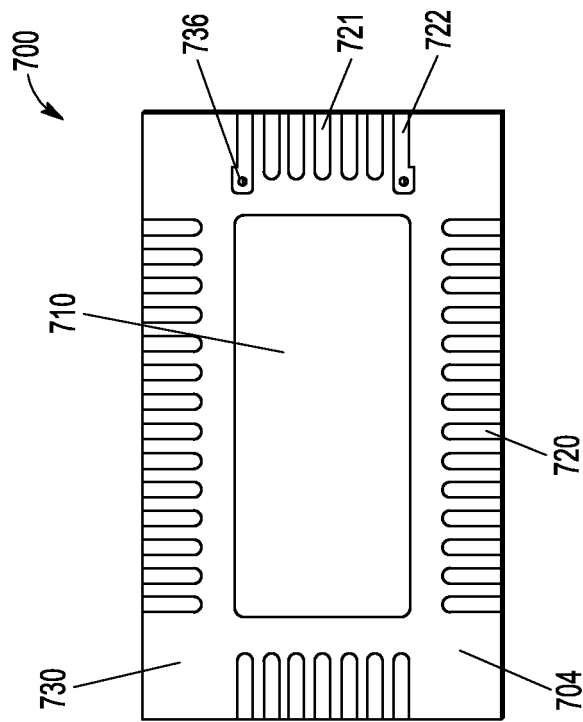
FIGS. 7-11 illustrate several stages in the manufacturing process of FIG. 6, in accordance with various embodiments.

FIG. 6 illustrates a flowchart of a method of manufacturing a leadframe and an air-cavity package for an electronic device, in accordance with various embodiments. FIG. 6 should be viewed in conjunction with FIGS. 7-11, which illustrate several stages in the manufacturing process. The below-described and illustrated leadframes and air-cavity packages correspond to QFN (Quad-Flat-No leads) packages. It should be understood that the various embodiments may be implemented in other types of packages, as well, including DFN (Dual-Flat-No leads) packages, and other packages in which the top and bottom surfaces of a leadframe feature are not encapsulated in a molding compound. In addition, although the leadframes illustrated and described herein include a conductive die pad, other embodiments may include leadframes or packages without conductive die pads.

In any event, the method may begin, in block 602, by providing a leadframe (e.g., leadframe 300 prior to formation of offset vent holes 336, FIG. 3). For example, the leadframe may be formed from copper, a copper alloy, or another rigid conductive material. The leadframe may include a die pad (e.g., die pad 710, FIG. 7) and a plurality of leads surrounding the die pad, where the die pad and the leads are held in a fixed, spatial orientation by sacrificial features. For example, the leads may include first leads 720 that will not include vent holes, second leads 721 integrally formed with the die pad 710, and third leads 722 that will include vent holes.

In blocks 604 and 606, which may be performed in parallel or sequentially, one or more vent holes 736 (e.g., offset vent hole 336, FIG. 3) are formed in one or more leadframe features by forming first and second openings (e.g., openings 320, 330, FIG. 3) partially through the leadframe feature(s). As discussed previously, the first and second openings extend from first and second surfaces (e.g., surfaces 410, 412, FIG. 4), respectively, of the leadframe feature(s). For example, the first and second openings may be formed through one or more leads (e.g., leads 722, FIG. 7) and/or the die pad (e.g., die pad 710, FIG. 7). As discussed in detail above, the vertical central axes (e.g., axes 428, 429, FIG. 4) of the openings are intentionally offset a horizontal distance, so that the resulting vent hole (e.g., vent hole 736, FIG. 7) includes a constricted portion (e.g., constricted portion 460, FIG. 4) with a relatively small, minimum cross-sectional area. After formation of the vent holes, at least those portions of the leadframe that include the vent holes may be plated with other conductive materials (e.g., gold) and/or a solder plating material (e.g., nickel palladium gold (NiPdAu) solder plating, or some other material) to ensure that the vent holes are solder wettable (e.g., so that the vent holes may later be filled with solder material).

In the above-described embodiment, one or more offset vent holes (e.g., offset vent holes 336, 736) are formed in a leadframe after the leadframe has been fabricated. In an alternate embodiment, the one or more offset vent holes may be formed in a leadframe simultaneously with fabrication of the leadframe itself. In other words, the leadframe and the vent hole(s) may be formed sequentially or simultaneously. For example, in an alternate embodiment, the one or more offset venting holes may be formed simultaneously with forming a leadframe's leads and die pad (e.g., using the same etching steps).

Figure 7:
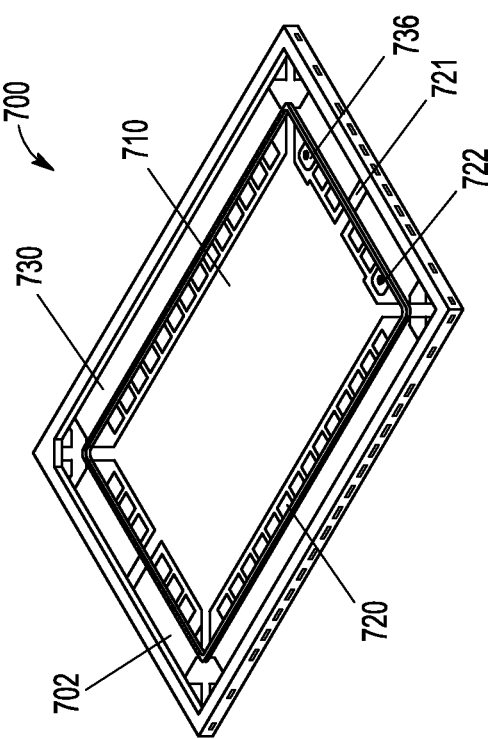

In block 608, and as shown in FIG. 7 (isometric view) and 8 (bottom view), a package base 700 (with top and bottom surfaces 702, 704) is formed by partially encapsulating the die pad 710 and leads 720, 721, 722 with molding compound 730 (e.g., a thermoplastic material, an epoxy resin molding compound, or other materials). During the encapsulation process, the offset vent holes 736 may be protected (e.g., temporarily covered or filled or clamped against a mold tool) so that molding compound does not obstruct or seal the vent holes 736. In addition, the mold compound is dispensed so that portions of the top surfaces of die pad 710 and leads 720-722 ultimately will be exposed within an air cavity of the package, and the bottom surfaces of die pad 710 and leads 720-722 ultimately will be exposed to the exterior environment at a bottom surface 704 of the package base 700. The outward ends of leads 720-722 also may be exposed to the exterior environment, as illustrated.

Figure 9:
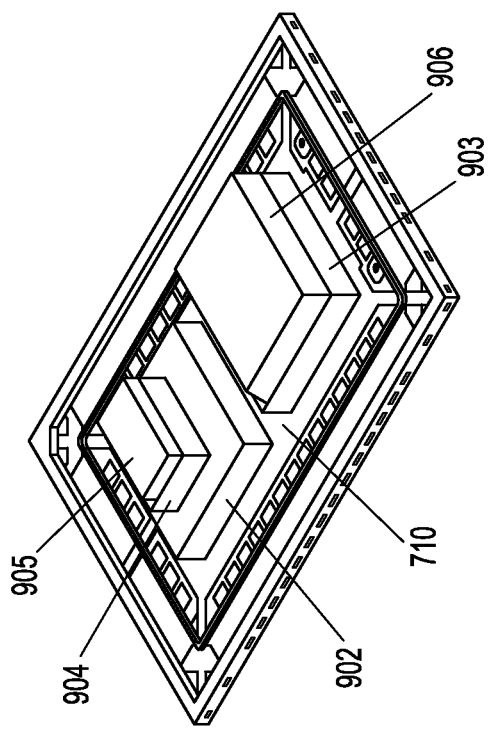

In block 610, and as shown in FIG. 9, one or more die 902, 903 may be attached to the die pad 710, and one or more additional die 904, 905, 906 or other components may be stacked above them. In block 612, wirebonds and/or other electrical connections (not illustrated) are coupled between some or all of the die 902-906 and the leads (e.g., leads 720, 722).

Figure 10:
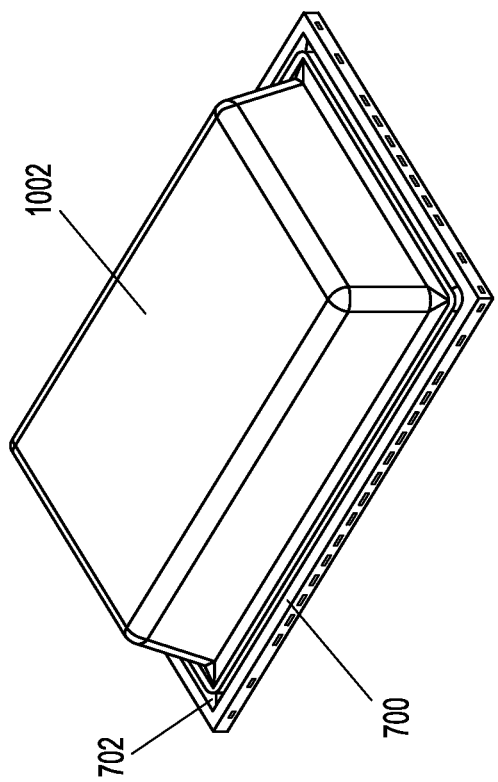

In block 614, and as shown in FIG. 10, a lid attach process is performed, in order to attach a lid 1002 to the top surface 702 of the package base 700. Once the lid 1002 is attached, an air cavity within the package is defined by the top surface of the package base 700 and the interior surface of the lid 1002. At this stage of manufacture, the offset vent hole(s) 736 allow air to flow between the air cavity and the exterior environment.

For example, the lid 1002 may be a dome shaped lid (as shown in FIG. 10). Alternatively, the package base may be configured to accept a flat lid. For example, lid 1002 may be formed from an organic plastic, liquid crystal polymer, aluminum, ceramic, glass, steel, and so on. In order to attach the lid 1002, a heat-curable adhesive or epoxy may be applied to the mating surface(s) of the lid 1002 and/or the package base 700, and the assembly is cured at an elevated temperature (e.g., between about 150° C. to 175° C. (300° F. to 350° F.)) for a cure period (e.g., about an hour). In alternate embodiments, the package base 700 and lid 1010 may be attached using solder or another material. During the lid attach process, the offset vent holes 736 allow for pressure normalization between the air cavity and the external environment.

Figure 11:
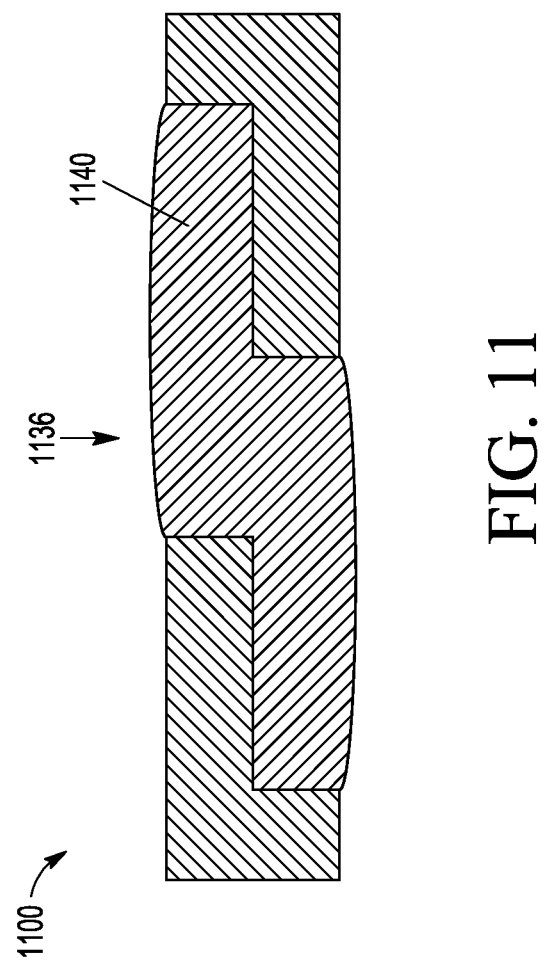

According to an embodiment, after completion of the lid attach process, the offset vent hole(s) 736 may be closed, in block 616, although they may remain open, in other embodiments. For example, as shown in FIG. 11, which is a cross-sectional view of a closed, offset vent hole 1136 (e.g., offset vent hole 336 or 736) through a leadframe feature 1100 (e.g., through lead 322 as in the cross-section of FIG. 4), solder 1140 may be deposited in the offset vent hole 1136 (e.g., during a solder reflow process) in order to close the offset vent hole 1136. In alternate embodiments, a fill material other than solder may be used to close the offset vent hole(s). Closure of the offset vent hole(s) results in a hermetic or semi-hermetic seal between the air cavity and the external environment.

In block 618, the sacrificial features of the leadframe may be removed. For example, in embodiments in which a leadframe includes multiple cells, removal of the sacrificial features may result in singulation of the packaged electronic devices. Alternatively, the sacrificial features of the leadframe may be removed at an earlier point in the manufacturing process. In any event, completion of the manufacturing process yields an electronic device packaged in an air cavity package, which includes one or more offset vent holes in one or more leadframe features.

An embodiment of a device includes a leadframe feature having a first surface, a second surface opposed to the first surface, and a vent hole formed between the first surface and the second surface. A cross-sectional area of the vent hole varies substantially between the first surface and the second surface. According to a further embodiment, the vent hole has a constricted portion between the first surface and the second surface, where a first cross-sectional area of the vent hole at the constricted portion is in a range from 10 to 90 percent of a second cross-sectional area at the first surface. According to another further embodiment, the vent hole includes a first opening extending from the first surface toward the second surface to a first depth that is less than a thickness of the leadframe feature, and a second opening extending from the second surface toward the first surface to a second depth that is less than the thickness of the leadframe feature, but that is large enough for the second opening to intersect the first opening. A vertical central axis of the first opening and a vertical central axis of the second opening are horizontally offset from each other by a distance in a range from 10 to 90 percent of a diameter of the first opening, and a constricted portion of the vent hole corresponds to an intersection of the first opening and the second opening. In another embodiment, the vertical central axis of the first opening and the vertical central axis of the second opening are horizontally offset from each other by a distance in a range from 25 to 75 percent of the diameter of the first opening. In yet another embodiment, the vertical central axis of the first opening and the vertical central axis of the second opening are horizontally offset from each other by a distance in a range from 50 to 90 percent of the diameter of the first opening.

An embodiment of a leadframe includes a leadframe feature having a first surface, a second surface opposed to the first surface, and a vent hole formed between the first surface and the second surface. A cross-sectional area of the vent hole varies substantially between the first surface and the second surface. According to a further embodiment, the vent hole includes a first opening extending from the first surface toward the second surface to a first depth that is less than a thickness of the leadframe feature, and a second opening extending from the second surface toward the first surface to a second depth that is less than the thickness of the leadframe feature, but that is large enough for the second opening to intersect the first opening. A vertical central axis of the first opening and a vertical central axis of the second opening are horizontally offset from each other by a distance in a range from 10 to 90 percent of a diameter of the first opening, and a constricted portion of the vent hole corresponds to an intersection of the first opening and the second opening. In another embodiment, the vertical central axis of the first opening and the vertical central axis of the second opening are horizontally offset from each other by a distance in a range from 25 to 75 percent of the diameter of the first opening.

An embodiment of a method includes forming a leadframe that includes a leadframe feature having a first surface and a second surface opposed to the first surface, and forming a vent hole between the first surface and the second surface of the leadframe feature. The vent hole is formed so that a cross-sectional area of the vent hole varies substantially between the first surface and the second surface. According to a further embodiment, forming the vent hole includes forming a first opening extending from the first surface toward the second surface to a first depth that is less than a thickness of the leadframe feature, and forming a second opening extending from the second surface toward the first surface to a second depth that is less than the thickness of the leadframe feature, but that is large enough for the second opening to intersect the first opening, where a vertical central axis of the first opening and a vertical central axis of the second opening are horizontally offset from each other by a distance in a range from 10 to 90 percent of a diameter of the first opening, and a constricted portion of the vent hole corresponds to an intersection of the first opening and the second opening.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A device comprising:
   a leadframe feature having a first surface, a second surface opposed to the first surface, and a vent hole formed between the first surface and the second surface, wherein a cross-sectional area of the vent hole varies substantially between the first surface and the second surface; and
   molding compound partially encapsulating the leadframe feature, wherein the molding compound is not disposed within the vent hole.

2. The device of claim 1, wherein the vent hole has a constricted portion between the first surface and the second surface, and wherein a first cross-sectional area of the vent hole at the constricted portion is in a range from 10 to 90 percent of a second cross-sectional area at the first surface.

3. The device of claim 2, wherein the first cross-sectional area is in a range from 25 to 90 percent of the second cross-sectional area.

4. The device of claim 3, wherein the first cross-sectional area is in a range from 50 to 90 percent of the second cross-sectional area.

5. The device of claim 1, wherein the vent hole comprises:
   a first opening extending from the first surface toward the second surface to a first depth that is less than a thickness of the leadframe feature; and
   a second opening extending from the second surface toward the first surface to a second depth that is less than the thickness of the leadframe feature, but that is large enough for the second opening to intersect the first opening, wherein a vertical central axis of the first opening and a vertical central axis of the second opening are horizontally offset from each other by a distance in a range from 10 to 90 percent of a diameter of the first opening, and wherein a constricted portion of the vent hole corresponds to an intersection of the first opening and the second opening.

6. The device of claim 5, wherein the vertical central axis of the first opening and the vertical central axis of the second opening are horizontally offset from each other by a distance in a range from 25 to 75 percent of the diameter of the first opening.

7. The device of claim 5, wherein the vertical central axis of the first opening and the vertical central axis of the second opening are horizontally offset from each other by a distance in a range from 50 to 90 percent of the diameter of the first opening.

8. The device of claim 5, wherein the first depth and the second depth each are in a range of 25 to 75 percent of the thickness of the leadframe feature.

9. The device of claim 1, wherein the leadframe feature is a lead having an elongated shape, and wherein with a first portion of the lead is oriented toward a die pad, a second portion of the lead is oriented away from the die pad, and a central portion of the lead extends between the first portion and the second portion, and wherein the vent hole is formed through the first portion of the lead.

10. The device of claim 1, wherein the leadframe feature is a die pad.

11. The device of claim 1, further comprising:
    fill material that seals the vent hole.

12. A device comprising:
a leadframe feature having a first surface, a second surface opposed to the first surface, and a vent hole formed between the first surface and the second surface, wherein a cross-sectional area of the vent hole varies substantially between the first surface and the second surface; and
a lid having a surface permanently coupled to the device, wherein the lid partially defines an air cavity, and wherein the vent hole allows airflow between the air cavity and an exterior of the device during a lid attach process.

13. A device comprising:
a leadframe feature having a first surface, a second surface opposed to the first surface, and a vent hole formed between the first surface and the second surface, wherein a cross-sectional area of the vent hole varies substantially between the first surface and the second surface; and
fill material that seals the vent hole, wherein the fill material comprises solder.

14. A device comprising:
a leadframe feature having a first surface, a second surface opposed to the first surface, and a vent hole formed between the first surface and the second surface, wherein a cross-sectional area of the vent hole varies substantially between the first surface and the second surface, wherein the leadframe feature is selected from a substantially planar die pad, and a lead of a plurality of leads that are located around a perimeter of the die pad; and
molding compound partially encapsulating the die pad and the plurality of leads, wherein a combination of the die pad, the plurality of leads, and the molding compound form a package base.

15. A method comprising:
forming a vent hole between a first surface and a second surface of a leadframe feature, wherein the vent hole is formed so that a cross-sectional area of the vent hole varies substantially between the first surface and the second surface; and
partially encapsulating the leadframe feature with molding compound, wherein the molding compound is not disposed within the vent hole.

16. The method of claim 15, wherein forming the vent hole comprises:
forming a first opening extending from the first surface toward the second surface to a first depth that is less than a thickness of the leadframe feature; and
forming a second opening extending from the second surface toward the first surface to a second depth that is less than the thickness of the leadframe feature, but that is large enough for the second opening to intersect the first opening, wherein a vertical central axis of the first opening and a vertical central axis of the second opening are horizontally offset from each other by a distance in a range from 10 to 90 percent of a diameter of the first opening, and wherein a constricted portion of the vent hole corresponds to an intersection of the first opening and the second opening.

17. A method comprising:
forming a vent hole between a first surface and a second surface of a leadframe feature, wherein the vent hole is formed so that a cross-sectional area of the vent hole varies substantially between the first surface and the second surface, wherein the leadframe feature is selected from a substantially planar die pad, and a lead of a plurality of leads that are located around a perimeter of the die pad;
partially encapsulating the die pad and the plurality of leads with molding compound, wherein a combination of the die pad, the plurality of leads, and the molding compound form a package base;
attaching one or more die to the die pad;
forming electrical connections between the one or more die and the plurality of leads;
performing a lid attach process to attach a lid to the package base over the one or more die, wherein a top surface of the package base and an interior surface of the lid define an air cavity, and wherein the vent hole remains open during the lid attach process; and
closing the vent hole after the lid attach process in order to seal the air cavity.

* * * * *